(12) United States Patent
Kato

(10) Patent No.: US 12,133,328 B2
(45) Date of Patent: Oct. 29, 2024

(54) CIRCUIT BOARD AND METHOD FOR PRODUCING CIRCUIT BOARD

(71) Applicant: Murata Manufacturing Co., Ltd., Nagaokakyo (JP)

(72) Inventor: Tomoki Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 289 days.

(21) Appl. No.: 17/741,906

(22) Filed: May 11, 2022

(65) Prior Publication Data

US 2022/0272837 A1 Aug. 25, 2022

Related U.S. Application Data

(63) Continuation of application No. PCT/JP2020/037876, filed on Oct. 6, 2020.

(30) Foreign Application Priority Data

Nov. 14, 2019 (JP) ................. 2019-206202

(51) Int. Cl.
| | |
|---|---|
| *H05K 1/03* | (2006.01) |
| *H05K 1/02* | (2006.01) |
| *H05K 3/46* | (2006.01) |

(52) U.S. Cl.
CPC ......... *H05K 1/0306* (2013.01); *H05K 1/0206* (2013.01); *H05K 3/4644* (2013.01); *H05K 2201/096* (2013.01); *H05K 2201/09827* (2013.01); *H05K 2203/1126* (2013.01)

(58) Field of Classification Search
CPC ...... H05K 1/03; H05K 1/0306; H05K 1/0206; H05K 3/4644; H05K 2201/096; H05K 2201/09827
USPC ........................................... 174/255
See application file for complete search history.

(56) References Cited

U.S. PATENT DOCUMENTS

| | | | |
|---|---|---|---|
| 2010/0181105 A1 | 7/2010 | Hitomi et al. | |
| 2010/0243311 A1 | 9/2010 | Niki et al. | |
| 2011/0198733 A1* | 8/2011 | Tomisaka | ............ H01L 23/3171 |
| | | | 257/622 |
| 2018/0206337 A1 | 7/2018 | Hanao et al. | |

FOREIGN PATENT DOCUMENTS

| | | |
|---|---|---|
| CN | 108029203 A | 5/2018 |
| JP | S6196548 U1 | 6/1986 |
| JP | H0714421 A | 1/1995 |
| JP | 2006041230 A | 2/2006 |
| JP | 2010171157 A | 8/2010 |

OTHER PUBLICATIONS

International Search Report issued for PCT/JP2020/037876, dated Dec. 22, 2020.

* cited by examiner

*Primary Examiner* — Tremesha W Burns
(74) *Attorney, Agent, or Firm* — ArentFox Schiff LLP

(57) ABSTRACT

A circuit board having an insulating layer containing a low-temperature sintering ceramic material and wiring. The wiring includes a thermal via having an area of 0.0025 mm² or more in top view thereof, the thermal via is a stack of layers of tapered conductors, each having tapered end faces, and each end face of the tapered conductors are in direct contact with the insulating layer.

7 Claims, 3 Drawing Sheets

CIRCUIT BOARD AND METHOD FOR PRODUCING CIRCUIT BOARD

CROSS REFERENCE TO RELATED APPLICATIONS

The present application is a continuation of International application No. PCT/JP2020/037876, filed Oct. 6, 2020, which claims priority to Japanese Patent Application No. 2019-206202, filed Nov. 14, 2019, the entire contents of each of which are incorporated herein by reference.

FIELD OF THE INVENTION

The present invention relates to a circuit board and a method for producing a circuit board.

BACKGROUND OF THE INVENTION

A known type of circuit board for mounting light emitters, semiconductor devices, and other heat-generating elements thereon is one made with a low-temperature sintering ceramic material as an insulating material.

Patent Document 1 discloses a wiring board for light emitters composed of an insulating base and a metallic element extending through the insulating base. The insulating base is a low-temperature fired ceramic fired at 1050° C. or below, and the metallic element has a higher thermal conductivity than the insulating base.

In Patent Document 1, the inventors carry out a step of perforating a predetermined point of a ceramic green sheet with a through hole and a step of placing a metal sheet on the perforated ceramic green sheet. The perforated area of the ceramic green sheet is pressed from the metal sheet side to plug the through hole with part of the metal sheet, thereby combining the ceramic green sheet and the metal sheet together.

Then the ceramic green sheet and the metal sheet are co-fired, giving an insulating base inside which a metal element extends through.

Patent Document 1: Japanese Unexamined Patent Application Publication No. 2006-41230

SUMMARY OF THE INVENTION

In Patent Document 1, the inventors join an insulating base and a metallic element extending therethrough together by co-firing a ceramic green sheet and a metal sheet. This, however, is disadvantageous in that the bond is weak because of a small bonding area between the insulating body and the metallic element.

Weak bonding between the insulating body and the metallic element can cause separation because of thermal stress resulting from, for example, heat production by a heat-generating element mounted on the metallic element.

There has also been a demand for more effective management of heat from the metallic element.

In light of this problem, the present invention is intended to provide a circuit board that achieves strong bonding of a conductor suitable for the management of heat produced by a heat-generating element (hereinafter referred to as a thermal via) to an insulating layer.

A circuit board according to an aspect of the present invention is one formed by an insulating layer and wiring, the insulating layer containing a low-temperature sintering ceramic material. The wiring includes a thermal via having an area of 0.0025 mm$^2$ or more in a top view, the thermal via is a stack of layers of tapered conductors, each having tapered end faces, and each end face of the tapered conductors is in direct contact with the insulating layer.

A method according to another aspect of the present invention for producing a circuit board includes perforating a ceramic green sheet with a through hole having different top and bottom spans and a top span area of 0.0025 mm$^2$ or more, the ceramic green sheet containing a low-temperature sintering ceramic material; forming a via conductor by filling the through hole with a conductor paste containing a metal; making a multilayer body by stacking multiple ones of the ceramic green sheets with the via conductor therein in such a manner that the via conductors are aligned with each other; and firing the multilayer body.

According to aspects of the present invention, there can be provided a circuit board that achieves strong bonding of a thermal via to an insulating layer.

DETAILED DESCRIPTION OF THE PREFERRED EMBODIMENTS

The following describes a circuit board according to an embodiment of the present invention and a method for producing the circuit board.

What is described below, however, is not the only possible forms of the present invention; the present invention can be applied with any necessary change within the scope of the present invention. Combinations of two or more of the specific preferred forms, described below, of the circuit board according to an embodiment of the present invention and the method for producing the circuit board are also part of the present invention.

A circuit board according to an aspect of the present invention is formed by an insulating layer and wiring, the insulating layer containing a low-temperature sintering ceramic material. The wiring includes a thermal via having an area of 0.0025 mm$^2$ or more in top view thereof.

Figure 1:
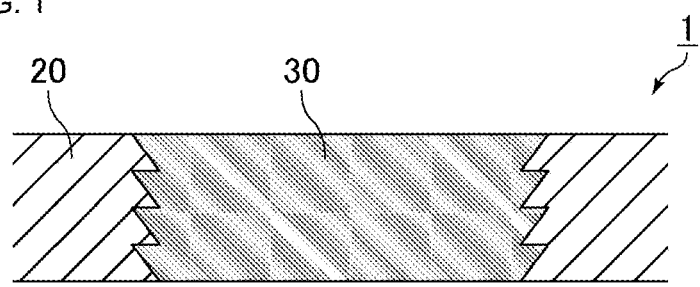
FIG. 1 is a cross-sectional diagram schematically illustrating an example of part of the structure of a circuit board according to the present invention.

FIG. 1 is a cross-sectional diagram schematically illustrating an example of part of the structure of a circuit board according to an aspect of the present invention.

In FIG. 1, a portion of a circuit board 1 is schematically illustrated in which it has a thermal via 30, part of wiring, in an insulating layer 20.

The insulating layer is a layer containing a low-temperature sintering ceramic material.

The term low-temperature sintering ceramic material refers to a ceramic material that sinters at temperatures of 1000° C. or below and can be co-fired with silver or copper, both of which are metallic materials preferred for use in the wiring.

Preferably, the low-temperature sintering ceramic material is $SiO_2$—CaO—$Al_2O_3$—$B_2O_3$ or $SiO_2$—MgO—$Al_2O_3$—$B_2O_3$ glass ceramic.

The circuit board includes wiring. Preferably, the wiring is formed by a silver- or copper-based highly electrically conductive metal.

It is also preferred that the wiring be made of the same material as the thermal via, described later herein.

The components of the wiring other than the thermal via are not detailed herein.

The thermal via is a piece of wiring having an area of 0.0025 mm² or more in top view thereof. Because of its large area, the thermal via is used as a piece of wiring for thermal management.

For example, a heat-generating element can be mounted on the top of the thermal via. In that case the thermal via is used to transmit the heat through it and release the transmitted heat from its bottom.

It should be noted that thermal vias are used for a different purpose than stacked vias, which are used to establish an electrical coupling in the direction of thickness of a circuit board.

The area in top view of the thermal via is 0.0025 mm² or more, preferably 0.015 mm² or more, more preferably 0.25 mm² or more.

Preferably, the area in top view of the thermal via is 100 mm² or less.

The shape in top view of the thermal via is not critical. Examples include round and polygonal (square, rectangular, etc.) shapes.

If the shape in top view of the thermal via is a circle, it is preferred that its diameter be 0.06 mm or more as this helps ensure the area in top view of the thermal via will be in any of the above ranges.

If the shape in top view of the thermal via is a square, it is preferred that each side of it measure 0.05 mm or more.

The thermal via is a stack of layers of tapered conductors, each having tapered end faces.

The thermal via 30 illustrated in FIG. 1 is formed by a stack of four layers of tapered conductors.

A real-world thermal via would have the multiple layers of tapered conductors as one solid structure. In FIG. 1, therefore, no boundary is drawn between the layers of tapered conductors.

Likewise, the portions of the insulating layer corresponding to the multiple layers of tapered conductors are also in one solid layer. In FIG. 1, therefore, no boundary is drawn between such strata of the insulating layer, too.

Figure 2:
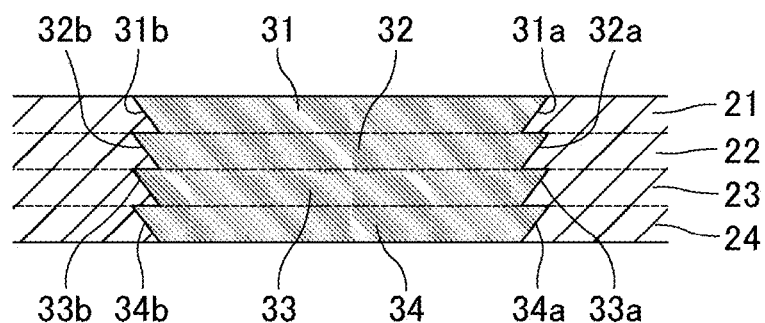
FIG. 2 is another representation of the tapered conductors in the thermal via in FIG. 1, illustrating them as separate layers.

FIG. 2 is another representation of the tapered conductors in the thermal via in FIG. 1, illustrating them as separate layers.

In FIG. 2, boundaries between the tapered conductors 31, 32, 33, and 34 forming the thermal via 30 are indicated by dotted lines.

On the right of the tapered conductors 31, 32, 33, and 34 are tapered end faces 31a, 32a, 33a, and 34a, respectively. On their left side, they also have tapered end faces 31b, 32b, 33b, and 34b, respectively.

The cross-sectional diagram in FIG. 2 looks as if the tapered conductors have a tapered end face on their left and right. Indeed, the end faces of the tapered conductors are tapered around all sides of the tapered conductors.

The end faces 31a, 32a, 33a, and 34a of the tapered conductors 31, 32, 33, and 34, furthermore, are in direct contact with the insulating layers 21, 22, 23, and 24, respectively.

As used herein, "tapered" represents a shape of a tapered conductor in cross-sectional view in which its end faces are not parallel with the direction of its thickness, but the conductor is wider at its top or bottom. Although the tapered conductors in FIG. 2 are in a top-wide tapered shape, a bottom-wide tapered shape can also be used.

The multiple tapered conductors forming the thermal via, furthermore, may be a mixture of top-wide and bottom-wide configurations.

The end faces forming the tapered shape, furthermore, do not need to be straight in their cross-sectional view; the end faces forming the tapered shape may be curved.

The thermal via in the circuit board according to an aspect of the present invention is in a shape formed by a stack of layers of tapered conductors, each having tapered end faces, and each end face of the tapered conductors is in direct contact with the insulating layer. Such a structure will ensure a large area of bonding when the end faces of the tapered conductors are joined to the insulating layer, and the resulting anchoring effect will make the thermal via and the insulating layer bond firmly.

Such a firm bonding between the thermal via and the insulating layer will prevent the separation between the thermal via and the insulating layer caused by thermal stress resulting from heat production by a heat-generating element.

There may be some voids (empty areas of space) at the interfaces between the end faces of the tapered conductors and the insulating layer.

Preferably, the taper length of the tapered conductors in cross-section is 20 μm or more.

Figure 3:
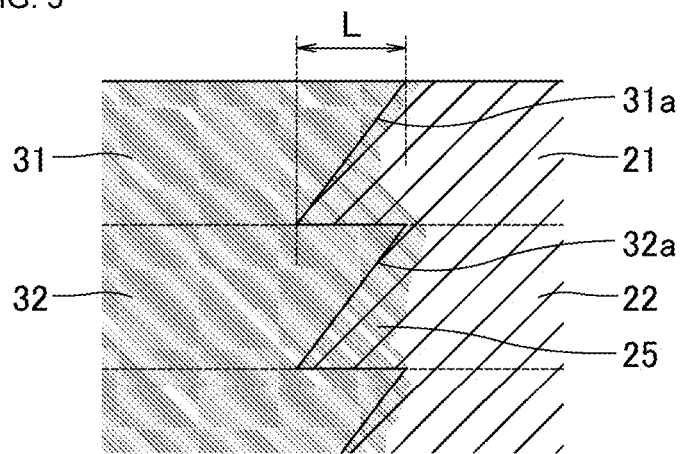
FIG. 3 is an enlarged diagram schematically illustrating end faces of tapered conductors.

FIG. 3 is an enlarged diagram schematically illustrating end faces of tapered conductors.

In FIG. 3, the taper length is indicated by bidirectional arrow L. The taper length is defined as the difference between an end of the wider side (top in FIG. 3) of the tapered conductors and that of the narrower side (bottom in FIG. 3).

FIG. 3 also illustrates a diffused portion 25, which is a portion of the insulating layer in which the metallic material that forms the tapered conductors has been diffused. The diffused portion will be described in detail later herein.

Preferably, the tapered conductors contain a silver- or copper-based highly electrically conductive metal.

The silver or copper can be co-fired with the low-temperature sintering ceramic material.

Preferably, furthermore, the tapered conductors contain a metal and the same low-temperature sintering ceramic material as in the insulating layer. Mixing the low-temperature sintering ceramic material with a metal makes the difference in the coefficient of thermal expansion between the thermal via and the portion of the insulating layer therearound smaller, thereby improving the strength of bonding between the thermal via and the insulating layer.

For stronger bonding between the thermal via and the insulating layer, it is preferred that the percentage by weight of the low-temperature sintering ceramic material in the tapered conductors be 10% or more.

For higher thermal conductivity of the tapered conductors, furthermore, it is better that the percentage by weight of the low-temperature sintering ceramic material in the tapered conductors be not too high. It is, therefore, preferred that the percentage by weight of the low-temperature sintering ceramic material in the tapered conductors be 50% or less.

Preferably, the thickness of the thermal via is 50 μm or more, more preferably 100 μm or more. Preferably, the thickness of the thermal via is 5000 μm or less.

Increasing the thickness of the thermal via is preferred because it will make the resistance of the thermal via smaller, thereby allowing a greater amount of current to flow through the thermal via.

The number of layers of tapered conductors stacked to form the thermal via is not critical. It is, however, preferred that the number of layers stacked be four or greater, more preferably 16 or greater. It is preferred that the number of layers stacked be 40 or smaller.

Preferably, the thickness of each layer of a tapered conductor is 25 μm or more, preferably 150 μm or less.

Because the thermal via has a large area in its top view, furthermore, the proportion of the area in top view of the thermal via to the thickness of the thermal via is large. It is, therefore, preferred that the aspect ratio of the thermal via, represented by (the equivalent circular diameter of the area in top view/thickness), be 1 or more. It is preferred that this aspect ratio be 25 or less.

Preferably, the insulating layer has a diffused portion, a portion in which the metallic material that forms the tapered conductors has been diffused, where it is in direct contact with each end face of the tapered conductors forming the thermal via.

FIG. 3 schematically illustrates the diffused portion 25 inside the insulating layers 21 and 22.

The presence of a diffused portion can be confirmed by carrying out an EDX elemental analysis. If the metallic material that forms the tapered conductors (e.g., silver or copper) is detected inside it, the insulating layer has a diffused portion.

A diffused portion inside the insulating layer improves the strength of bonding between the thermal via and the insulating layer. It also makes the differences in the coefficient of thermal expansion near the interface between the thermal via and the insulating layer milder, thereby improving strength against thermal stress caused by the difference in the coefficient of thermal expansion. As a result, the damage to the joint that would occur under hot conditions (e.g., holding at 80° C./30 minutes) will be prevented.

By co-firing a conductor paste as a starting material for the thermal via with ceramic green sheets containing the low-temperature sintering ceramic material as a starting material for the insulating layer, a diffused portion can be formed inside the insulating layer by diffusing the metallic material thereinto. In other words, the presence of a diffused portion constitutes evidence for one to presume that the production of the circuit board involved co-firing of a conductor paste and ceramic green sheets.

Figure 4:
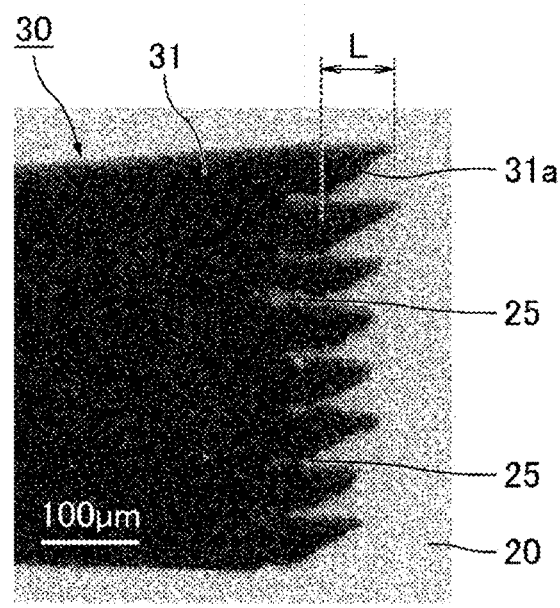
FIG. 4 is a cross-sectional image representing an example of a thermal via in a circuit board according to the present invention and part of an insulating layer in direct contact with the thermal via.

FIG. 4 is a cross-sectional image representing an example of a thermal via in a circuit board according to an aspect of the present invention and part of an insulating layer in direct contact with the thermal via.

The image in FIG. 4 is a cross-sectional image of the circuit board obtained in Example 1, described later herein.

In FIG. 4, a thermal via 30 and an insulating layer 20 are illustrated. Besides these, a tapered conductor 31 is indicated by a reference sign to represent the tapered conductors, and an end face 31a of a tapered conductor to represent the end faces of tapered conductors.

The diffused portion 25 is the slightly toned and darker portion inside the portion of the insulating layer 20 adjacent to the thermal via 30 in the image. Some points are indicated by the reference sign of 25 to represent the area where the diffused portion lies.

The taper length, furthermore, is indicated by bidirectional arrow L.

When the thermal via is a stack of layers of tapered conductors, each having tapered end faces, with each end face in direct contact with the insulating layer as in FIG. 4, the anchoring effect occurs in the bonding between the end faces of the tapered conductors and the insulating layer. As a result, the thermal via and the insulating layer bond firmly.

A diffused portion inside the insulating layer, furthermore, improves the strength of bonding between the thermal via and the insulating layer.

Figure 5:
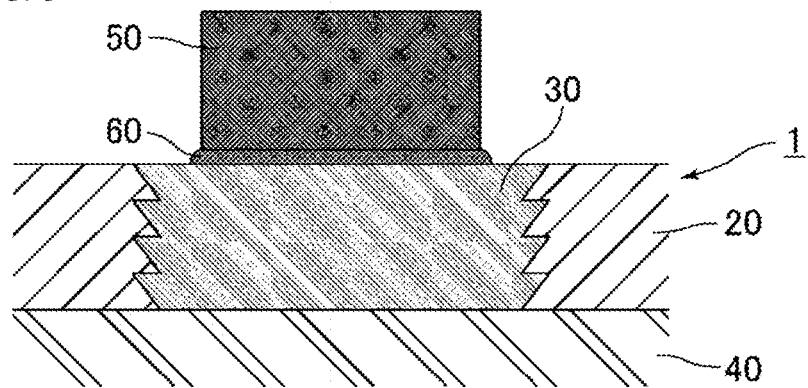
FIG. 5 is a cross-sectional diagram schematically illustrating an example of a circuit board with a highly heat-conducting ceramic substrate in contact with the bottom of the thermal via and a heat-generating element mounted on the top of the thermal via.

FIG. 5 is a cross-sectional diagram schematically illustrating an example of a circuit board with a highly heat-conducting ceramic substrate in contact with the bottom of the thermal via and a heat-generating element mounted on the top of the thermal via.

In FIG. 5, a highly heat-conducting ceramic substrate 40 is in contact with the bottom of the thermal via 30 of the circuit board 1 is illustrated. There is also a heat-generating element 50 mounted with solder 60 on the top of the thermal via 30.

The circuit board according to an aspect of the present invention may include a highly heat-conducting ceramic substrate in contact with the bottom of the thermal via. A highly heat-conducting ceramic substrate in contact with the bottom of the thermal via allows for direct transmission of heat from the thermal via to it.

Preferably, the highly heat-conducting ceramic substrate is a sintered ceramic substrate, preferably made of, for example, silicon nitride, aluminum nitride, alumina, or silicon carbide.

Preferably, the heat-generating element(s) mounted on the top of the thermal via is element(s) of at least one class selected from the group consisting of power elements, controllers, passive components, and light emitters.

Preferably, power element(s) is one(s) made of a wide-band-gap semiconductor, preferably silicon carbide or gallium nitride.

Preferably, light emitter(s) is one(s) of at least one class selected from the group consisting of LEDs, organic LEDs, LIDAR devices, RADAR devices, millimeter-wave devices.

Heat-generating element(s) mounted on the top of the thermal via in the circuit board according to the present invention allows for the use of the circuit board according to the present invention as a heat-generating-element-mounted board.

Next is described an example of a method for producing the circuit board according to an aspect of the present invention.

The circuit board according to an aspect of the present invention can be produced by a method that includes a step of perforating a ceramic green sheet with a through hole having different top and bottom spans and a top span area of 0.0025 mm² or more, the ceramic green sheet containing a low-temperature sintering ceramic material; a step of forming a via conductor by filling the through hole with a conductor paste containing a metal; a step of making a multilayer body by stacking multiple ones of the ceramic green sheets with a via conductor therein in such a manner that the via conductors are aligned with each other; and a step of firing the multilayer body.

First, a ceramic green sheet containing a low-temperature sintering ceramic material is prepared.

The inorganic solid component for the ceramic green sheet can be a powder of a low-temperature sintering ceramic material as described above. A powder mixture further containing an alumina powder may also be used.

An example of a ceramic green sheet is a sheet obtained by adding a resin, a dispersant, a plasticizer, and a solvent to such a powder, mixing the ingredients to give slurry, and spreading the slurry to a predetermined thickness by doctor blading.

The ceramic green sheet is perforated with a through hole having different top and bottom spans and a top span area of 0.0025 mm² or more.

The through hole can be created by punching with a punch having a shape in which the top and bottom spans are different and in which the top span area is 0.0025 mm² or more.

Alternatively, the through hole can be created using a laser puncher configured to cut a hole having a top span area of 0.0025 mm² or more and different top and bottom spans.

Then a via conductor is formed by filling the through hole with a conductor paste containing a metal.

Preferably, the conductor paste is one that contains silver or copper.

It is, furthermore, preferred that the conductor paste contain a metal and the same low-temperature sintering ceramic material as in the ceramic green sheet, and that the percentage by weight of the low-temperature sintering ceramic material to the total weight of the metal and the low-temperature sintering ceramic material be 50% or less.

In addition, it is preferred that the percentage by weight of the low-temperature sintering ceramic material to the total weight of the metal and the low-temperature sintering ceramic material be 10% or more.

The conductor paste may contain a resin component, a solvent, a dispersant, etc.

Then a multilayer body is made by stacking multiple ones of the ceramic green sheets with a via conductor therein in such a manner that the via conductors will be aligned with each other.

Figure 6:
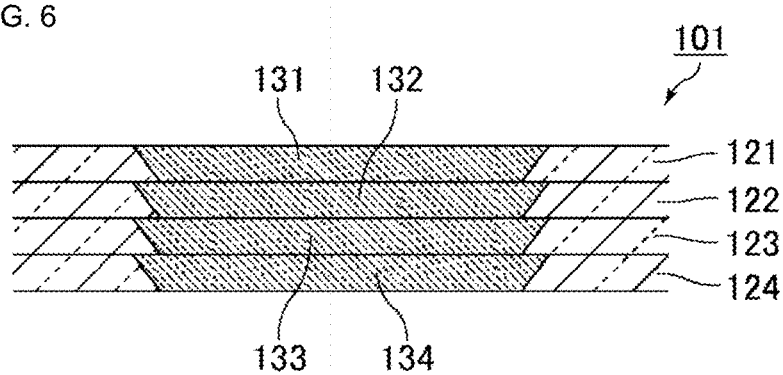
FIG. 6 is a cross-sectional diagram schematically illustrating an example of a multilayer body.

FIG. 6 is a cross-sectional diagram schematically illustrating an example of a multilayer body.

The multilayer body 101 illustrated in FIG. 6 is a stack of ceramic green sheets 124, 123, 122, and 121 with via conductors 134, 133, 132, and 131, respectively, therein.

The via conductors 134, 133, 132, and 131 are aligned with each other.

In FIG. 6, the via conductors are illustrated as they are in exactly the same position from layer to layer. The via conductors, however, may be displaced from layer to layer as long as they overlap so that they can be electrically coupled together.

Then the multilayer body is fired.

Preferably, the multilayer body is fired at a temperature suitable for the sintering of the low-temperature sintering ceramic material. For example, it is preferred that the firing temperature be 1000° C. or below. More preferably, the firing temperature is 850° C. to 990° C.

Preferably, the duration of firing (length of time of holding at the firing temperature) is 10 minutes to 30 minutes.

Pressurized firing, in which the multilayer body is fired under pressure, may also be performed.

Preferably, the atmosphere in which the firing is done is in the air.

By firing, the low-temperature sintering ceramic material contained in the ceramic green sheets is sintered, forming an insulating layer. The stacked via conductors are combined into a thermal via.

Firing a multilayer body 101 as illustrated in FIG. 6 will give a circuit board 1 having the structure illustrated in FIG. 1.

It is also preferred to place a constraining layer over and under the multilayer body before firing it.

The constraining layers are sheets obtained by adding a resin, a dispersant, a plasticizer, and a solvent to a ceramic powder that does not sinter in the firing step, mixing the ingredients to give slurry, and spreading the slurry by doctor blading. Preferably, the ceramic powder used to make the constraining layers is an alumina powder. Preferably, the thickness of the sheets is, for example, 0.2 mm.

Constraining layers help control the shrinkage of the ceramic green sheets in the firing step, thereby helping improve dimensional accuracy for the insulating layer.

In the firing of the multilayer body, the low-temperature sintering ceramic material and the via conductors are co-fired. The co-firing will form an insulating layer and a thermal via at the same time.

In such a way, one can obtain a firmly bonded structure of an insulating layer and a thermal via without using an adhesive to join them together.

By doing co-firing, furthermore, a diffused portion can be formed inside the insulating layer by diffusing the metallic material thereinto. A diffused portion makes the differences in the coefficient of thermal expansion near the interface between the thermal via and the insulating layer milder, thereby improving strength against thermal stress caused by the difference in the coefficient of thermal expansion. As a result, the damage to the joint that would occur under hot conditions (e.g., holding at 80° C./30 minutes) will be prevented.

EXAMPLES

The following are examples as more specific disclosures of the circuit board and the method for producing a circuit board according to the present invention. It should be noted that these examples are not the only possible forms of the present invention.

Example 1

As a starting material, an alumina powder was prepared. A borosilicate glass powder was also prepared that compositionally contained 59% by weight $SiO_2$, 10% by weight $B_2O_3$, 25% by weight CaO, and 6% by weight $Al_2O_3$.

This glass powder is a low-temperature sintering ceramic material.

These alumina and glass powders were mixed together in a ratio by weight of 40:60, and the resulting powder mixture was mixed with appropriate amounts of a binder, a dispersant, a plasticizer, an organic solvent, etc., to give a ceramic slurry.

Then an alumina powder was mixed with appropriate amounts of a binder, a dispersant, a plasticizer, an organic solvent, etc., to give a constraining-layer slurry.

After degassing, the ceramic slurry and the constraining-layer slurry were spread into 100-μm thick ceramic green sheets and constraining-layer sheets, respectively, by doctor blading.

Then the 100-μm thick ceramic green sheets were perforated, by punching, with a 0.05-mm square through hole in such a manner that the hole would have different spans at its top and bottom.

A via conductor was formed by filling the resulting through hole with a silver-containing conductor paste.

The silver-containing conductor paste contained the same glass powder as the low-temperature sintering ceramic material in the ceramic green sheets. The percentage by weight of the low-temperature sintering ceramic material to the total weight of the metal and the low-temperature sintering ceramic material in the conductor paste was 10%.

Subsequently, a multilayer body was made by stacking sheets as follows.

First, one constraining sheet was placed as the outermost layer. Then fifteen ceramic green sheets with a via conductor therein were stacked, and one constraining sheet was placed as the innermost layer. In the stacking of the ceramic green sheets, the via conductors were aligned with each other.

The multilayer body obtained in this stacking process was then pressed in the direction of thickness.

Then the pressed multilayer body was fired at 900° C., completing a circuit board.

The low-temperature sintering ceramic material and the via conductors were co-fired, forming an insulating layer and a thermal via at the same time.

As for the thickness of each stratum in the insulating layer resulting after firing, the thickness in the insulating layer was 50 μm if the thickness as a ceramic green sheet was 100 μm.

Then the constraining layers, placed over and under the multilayer body, were removed by preliminary cleaning with a sonicator and subsequent blasting with a wet blasting machine.

Comparative Example 1

Ceramic green sheets and constraining-layer sheets were prepared in the same way as in Example 1. Then the 100-μm thick ceramic green sheets were perforated, by punching, with a 0.05-mm square through hole having equal spans at its top and bottom.

One constraining sheet was placed as the outermost layer, then fifteen ceramic green sheets perforated with a through hole were stacked, and one constraining sheet was placed as the innermost layer. The through hole was not filled with a conductor paste. In the stacking of the ceramic green sheets, the through holes were aligned with each other.

The multilayer body obtained in this stacking process was then pressed in the direction of thickness.

Then, as in Example 1, the pressed multilayer body was fired at 900° C. Subsequently, the constraining layers, placed over and under the multilayer body, were removed by preliminary cleaning with a sonicator and subsequent blasting with a wet blasting machine.

Then a silver metal plate was inserted into the through hole in the fired multilayer body, and the metal plate and the insulating layer were joined together with an adhesive. In this way, a circuit board was obtained.

[Bonding Strength Test]

The thermal via in the circuit board of Example 1 and the metal plate in the circuit board of Comparative Example 1 were each plated at their top with nickel/gold. Then a lead wire was soldered onto the nickel/gold-plated surface.

Subsequently, this lead wire was held at one end with a tensile strength tester. The lead wire was lifted up while the load was measured, and the load at the detachment of the thermal via or metal plate from the circuit board was determined.

The load divided by the area of the through hole (0.05-mm square) was reported as bonding strength.

This test for evaluating bonding strength was carried out at room temperature (24° C.) and after high-temperature treatment (holding at 80° C./30 minutes in a temperature-controlled chamber). The results are presented in FIG. 7.

Figure 7:
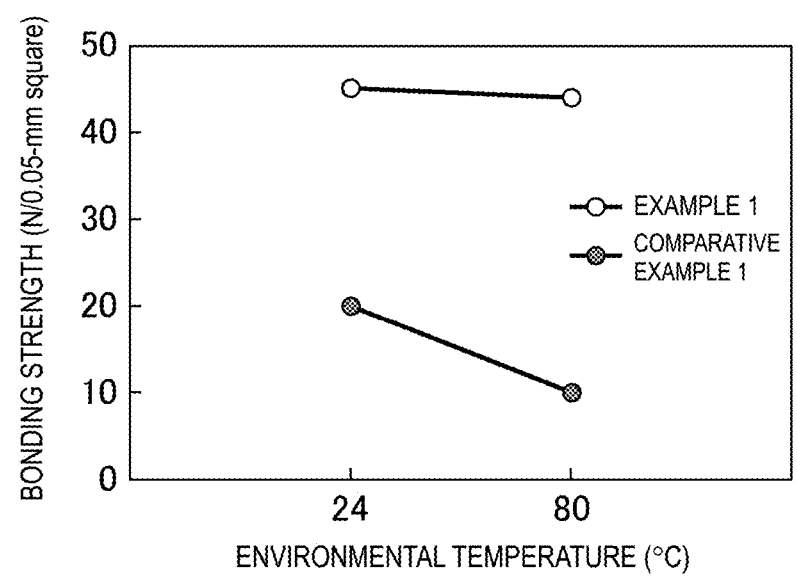
FIG. 7 is a graphical representation of bonding strength in Example 1 and Comparative Example 1.

FIG. 7 is a graphical representation of bonding strength in Example 1 and Comparative Example 1.

As shown in FIG. 7, for the circuit board of Example 1, the bonding strength at room temperature was high, and the decrease in bonding strength was small even after high-temperature treatment.

[Cross-Sectional Observation]

A cross-sectional image was taken that represents an example of a thermal via in the circuit board obtained in Example 1 and part of an insulating layer in direct contact with the thermal via. This image is the cross-sectional image given in FIG. 4.

As shown in the description of FIG. 4, the formation of a diffused portion inside the insulating layer was observed.

Example 2

Ceramic green sheets and constraining-layer sheets were prepared in the same way as in Example 1.

Then the 100-μm thick ceramic green sheets were perforated, by punching, with a 4-mm square through hole in such a manner that the hole would have different spans at its top and bottom.

A via conductor was formed by filling the resulting through hole with a copper-containing conductor paste.

The copper-containing conductor paste contained the same glass powder as the low-temperature sintering ceramic material in the ceramic green sheets. The percentage by weight of the low-temperature sintering ceramic material to the total weight of the metal and the low-temperature sintering ceramic material in the conductor paste was 10%.

A multilayer body was made and fired in the same way as in Example 1, except that the number of ceramic green sheets with a via conductor therein was changed to 20. The constraining-layer sheets were removed as in Example 1, completing a circuit board.

Comparative Example 2

Ceramic green sheets and constraining-layer sheets were prepared in the same way as in Example 1.

Then the 100-μm thick ceramic green sheets were perforated in their 4-mm square area with eight 0.15-mm diameter through holes having equal spans at their top and bottom, with the hole-to-hole pitch being 0.2 mm.

Via conductors were formed by filling the resulting through holes with the same conductor paste as used in Example 2.

On one of the ceramic green sheets, a 4-mm square via pad was formed by printing.

With this ceramic green sheet with a via pad thereon as the uppermost layer, a multilayer body was made by adding 19 ceramic green sheets with via conductors therein.

In addition, a constraining-layer sheet was placed over and under the multilayer body.

Except for these, a multilayer body was made and fired in the same way as in Example 1. The constraining-layer sheets were removed as in Example 1, completing a circuit board.

Comparative Example 3

Ceramic green sheets and constraining-layer sheets were prepared in the same way as in Example 1.

A multilayer body was made by stacking 20 ceramic green sheets, and this multilayer body was fired with a constraining-layer sheet placed over and under it.

After the removal of the constraining-layer sheets, the insulating layer was perforated, using a laser working machine, with a 4-mm square through hole having equal spans at its top and bottom.

Then a copper metal plate 4.02 mm square in top view was press-fitted into the through hole. In this way, a circuit board was obtained.

Comparative Example 4

The same process as in Comparative Example 3 was followed to the step of making a through hole.

Instead of the step of press-fitting a copper metal plate into the through hole, a copper metal plate 3.9 mm square in top view was inserted into the through hole and joined to the insulating layer with an adhesive. In this way, a circuit board was obtained.

[Thermal Management Test]

The thermal via in the circuit board of Example 2, the via pad on the circuit board of Comparative Example 2, and the copper metal plates in Comparative Examples 3 and 4 were each plated at their top with nickel/gold.

Then a heat-generating element was mounted on the nickel/gold-plated surface by soldering.

A power of 1 W was applied to the heat-generating element (power element). Ten minutes later, the surface temperature of the circuit board and that of the heat-generating element were measured with a thermographic camera.

The circuit board was considered acceptable if its highest temperature was 120° C. or below and if the highest temperature of the heat-generating element was 150° C. or below.

The results for the Example and Comparative Examples are summarized in Table 1.

TABLE 1

| | Example 2 | Comparative Example 2 | Comparative Example 3 | Comparative Example 4 |
|---|---|---|---|---|
| Highest temperature of the circuit board [° C.] | 119.4 | 139.1 | 137.7 | 131.6 |
| Highest temperature of the heat-generating element [° C.] | 145.3 | 189.5 | 150.2 | 313.6 |

As can be seen from these results, the circuit board of Example 2 was one having a thermal via superior in heat management; the highest temperature of the surface of the circuit board was low, and the highest temperature of the heat-generating element was also low.

Example 3

Ceramic green sheets and constraining-layer sheets were prepared in the same way as in Example 1.

Then the 100-μm thick ceramic green sheets were perforated, by punching, with a 2-mm square through hole in such a manner that the hole would have different spans at its top and bottom.

Types of conductor pastes were prepared with silver as the metal therein, with different percentages by weight of the low-temperature sintering ceramic material to the total weight of silver and the low-temperature sintering ceramic material.

The percentage by weight of the low-temperature sintering ceramic material was 0% by weight, 10% by weight, 30% by weight, or 50% by weight.

Then a via conductor was formed by filling the through hole, created beforehand, with a silver-containing conductor paste.

Multilayer bodies were made and fired in the same way as in Example 1, except that the number of ceramic green sheets with a via conductor therein was changed to 20. The constraining-layer sheets were removed as in Example 1, completing circuit boards.

The via conductors in the twenty ceramic green sheets forming the same multilayer body were formed with the same conductor paste.

Comparative Example 5

Ceramic green sheets and constraining-layer sheets were prepared in the same way as in Example 1.

Then the 100-μm thick ceramic green sheets were perforated, by punching, with a 2-mm square through hole having equal spans at its top and bottom.

Types of conductor sheets 2.02 mm square in top view and 50 μm thick were prepared with different percentages by weight of the low-temperature sintering ceramic material to the total weight of silver and the low-temperature sintering ceramic material.

The percentage by weight of the low-temperature sintering ceramic material was 0% by weight, 10% by weight, 30% by weight, or 50% by weight.

Then a via conductor was formed by press-fitting a conductor sheet into the through hole, created beforehand.

Multilayer bodies were made and fired in the same way as in Example 1, except that the number of ceramic green sheets with a via conductor therein was changed to 20. The constraining-layer sheets were removed as in Example 1, completing circuit boards.

The via conductors in the twenty ceramic green sheets forming the same multilayer body were formed with the same type of conductor sheet.

[Bonding Strength Test]

The thermal via in the circuit boards of Example 3 and the conductor sheet in the circuit boards of Comparative Example 5 were each plated at their top with nickel/gold. Then a lead wire was soldered onto the nickel/gold-plated surface.

Subsequently, this lead wire was held at one end with a tensile strength tester. The lead wire was lifted up while the load was measured, and the load at the detachment of the thermal via or conductor sheet from the circuit board was determined.

The load divided by the area of the through hole (2-mm square) was reported as bonding strength.

This test for evaluating bonding strength was carried out at baseline, or before temperature cycling (−40° C. to 125° C., 1000 cycles), and after the temperature cycling. The results are summarized in Table 2.

TABLE 2

| Percentage by weight of the low-temperature sintering ceramic material [%] | Example 3 (end faces tapered) | | | | Comparative Example 5 (end faces not tapered) | | | |
|---|---|---|---|---|---|---|---|---|
| | 0 | 10 | 30 | 50 | 0 | 10 | 30 | 50 |
| Initial bonding strength [N/2-mm square] | 40 | 45 | 45 | 45 | 20 | 25 | 25 | 25 |
| Bonding strength after temperature cycling [N/2-mm square] | 40 | 45 | 45 | 45 | 10 | 10 | 10 | 10 |

As can be seen from these results, the circuit boards of Example 3 achieved high initial bonding strength, and their bonding strength remained high even after temperature cycling.

The bonding strength, furthermore, was higher when a low-temperature sintering ceramic material was contained than when its percentage by weight was 0%. This demonstrates that when the tapered conductors contain the same low-temperature sintering ceramic material as in the insulating layer, the difference in the coefficient of thermal expansion between the thermal via and the portion of the insulating layer therearound is smaller, and, as a result, the strength of bonding between the thermal via and the insulating layer is improved. The results also indicate it is better for stronger bonding between the thermal via and the insulating layer that the percentage by weight of the low-temperature sintering ceramic material be 10% or more.

REFERENCE SIGNS LIST

1 Circuit board
20, 21, 22, 23, 24 Insulating layer
25 Diffused portion
30 Thermal via
31, 32, 33, 34 Tapered conductor
31a, 32a, 33a, 34a, 31b, 32b, 33b, 34b End face of a tapered conductor
40 Highly heat-conducting ceramic substrate
50 Heat-generating element
60 Solder
101 Multilayer body
121, 122, 123, 124 Ceramic green sheet
131, 132, 133, 134 Via conductor

The invention claimed is:

1. A circuit board comprising:
   an insulating layer containing a low-temperature sintering ceramic material; and
   wiring that includes a thermal via having an area of 0.0025 mm$^2$ or more in a top view thereof, wherein
   the thermal via is a stack of layers of tapered conductors, each having tapered end faces,
   each end face of the tapered conductors is in contact with the insulating layer,
   the tapered conductors contain a metal and the low-temperature sintering ceramic material, and
   a percentage by weight of the low-temperature sintering ceramic material in the tapered conductors is 10% to 50%.

2. The circuit board according to claim 1, wherein a taper length of the tapered conductors in cross-section is 20 μm or more.

3. The circuit board according to claim 1, wherein the metal is a silver- or copper-based electrically conductive metal.

4. The circuit board according to claim 1, wherein the insulating layer has a diffused portion in which a metallic material forming the tapered conductors has been diffused where the insulating layer is in direct contact with each end face of the tapered conductors.

5. The circuit board according to claim 1, wherein a thickness of the thermal via is 50 μm or more.

6. The circuit board according to claim 1, wherein the low-temperature sintering ceramic material is $SiO_2$—CaO—$Al_2O_3$—$B_2O_3$ or $SiO_2$—MgO—$Al_2O_3$—$B_2O_3$ glass ceramic.

7. The circuit board according to claim 1, wherein the area of the thermal via in the top view thereof is 0.0025 mm$^2$ to 100 mm$^2$.

* * * * *